(12) United States Patent
Lee et al.

(10) Patent No.: US 8,045,332 B2
(45) Date of Patent: Oct. 25, 2011

(54) MULTI-DIRECTION WEDGE CLAMP

(75) Inventors: Ying-Ming Lee, Melbourne, FL (US); Matthew Neil, Irvine, CA (US); Neal Knoblock, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 680 days.

(21) Appl. No.: 12/178,088

(22) Filed: Jul. 23, 2008

(65) Prior Publication Data

US 2010/0020514 A1    Jan. 28, 2010

(51) Int. Cl.
*H05K 5/00*    (2006.01)
(52) U.S. Cl. .......................... 361/759; 361/802; 361/756
(58) Field of Classification Search ................. 361/702, 361/704, 719, 721, 756, 759, 741, 727, 686, 361/801–802; 439/327, 55, 59, 259, 260, 439/326, 374, 377, 625, 626, 629–630, 636–637
See application file for complete search history.

(56) References Cited

U.S. PATENT DOCUMENTS

| 4,298,904 A | | 11/1981 | Koenig |
| 4,354,770 A | * | 10/1982 | Block ........................ 403/409.1 |
| 4,775,260 A | | 10/1988 | Kecmer |
| 4,819,713 A | | 4/1989 | Weisman |
| 4,909,752 A | * | 3/1990 | Hallum et al. ................. 439/325 |
| 5,071,013 A | | 12/1991 | Peterson |
| 5,090,840 A | | 2/1992 | Cosenza |
| 5,224,016 A | | 6/1993 | Weisman et al. |
| 5,472,353 A | * | 12/1995 | Hristake et al. ............... 439/327 |
| 5,485,353 A | * | 1/1996 | Hayes et al. ................... 361/802 |
| 5,859,764 A | * | 1/1999 | Davis et al. .................... 361/704 |
| 6,285,564 B1 | * | 9/2001 | O'Brien ........................ 361/801 |
| 6,873,528 B2 | * | 3/2005 | Hulan et al. ................... 361/719 |
| 7,193,850 B2 | * | 3/2007 | Pal ................................ 361/700 |
| 7,349,221 B2 | * | 3/2008 | Yurko ........................... 361/719 |

* cited by examiner

*Primary Examiner* — Hung S Bui
(74) *Attorney, Agent, or Firm* — Fox Rothschild, LLP; Robert J. Sacco

(57) ABSTRACT

A circuit card clamp (300) including a base member (316), at least one first wedge member (446), and a thermally conductive membrane (350). The base member has an elongated shape configured for insertion in a circuit card chassis slot (106). The first wedge member is movable relative to the base member in response to a first actuator (304) for engaging the circuit card chassis slot. The thermally conductive membrane is coupled to the base member and the first wedge member. The thermally conductive membrane has slack for permitting the first wedge member to move relative to the base member between a first clamped position and a second unclamped position. The thermally conductive membrane defines a thermal conductive path (206) between a circuit card (104) and the chassis slot for releasably securing a circuit card in the circuit card chassis slot.

20 Claims, 7 Drawing Sheets

MULTI-DIRECTION WEDGE CLAMP

BACKGROUND OF THE INVENTION

1. Statement of the Technical Field

The invention concerns clamping mechanisms, and more particularly, clamping mechanisms for fastening printed circuit boards or printed circuit cards to chassis.

2. Description of the Related Art

Traditionally, circuit card clamps have been used for fastening circuit cards within a slot of a chassis such as a heat exchanger, heat sink, or cold plate. For example, U.S. Pat. No. 4,775,260 to Kecmer (hereinafter "Kecmer"), U.S. Pat. No. 5,071,013 to Peterson (hereinafter "Peterson"), and U.S. Pat. No. 4,298,904 to Koenig (hereinafter "Koenig") describe circuit card clamps consisting of threaded rods with wedge-shaped bodies disposed thereon. A circuit card clamp coupled to a circuit card can be inserted into a chassis slot. Subsequently, the threaded rod can be rotated with a tool (i.e., torque wrench) in order to shorten the length of the circuit card clamp. By shortening the circuit card clamp, the wedge-shaped bodies are compressed thereby creating an increase in the circuit card clamp's width. As a result, a clamping force is exerted by the circuit card clamp securing the circuit card to the chassis.

The above described circuit card clamps suffer from certain drawbacks. For example, if the circuit card clamp is actuated so that it exerts a clamping force on the circuit card, then the circuit card is in contact with at least one wall of the chassis. In this scenario, thermal energy generated by the circuit card is passed to the chassis, thereby providing conduction cooling. However, the conduction cooling provided by such a clamp configuration is insufficient for Versa Module Eurcard (VME) cards having a fifty (50) watts power dissipation design. Further, the clamping forces exerted by the above described circuit card clamps are insufficient for adequately fastening a circuit card to a chassis to prevent loosening of the circuit card when exposed to external forces (such as vibration forces).

In view of the forgoing, there is a need for a wedge assembly that is able to provide improved conduction cooling (or thermal performance). The wedge assembly also needs to provide an improved clamping force for adequately fastening a circuit card to a chassis.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The present invention concerns a circuit card clamp. The circuit card clamp is comprised of a base member, a first wedge member, and a thermally conductive membrane. The base member has an elongated shape configured for insertion in a circuit card chassis slot. The first wedge member is movable relative to the base member in response to a first actuator for engaging the circuit card chassis slot. The thermally conductive membrane is coupled to the base member and the first wedge member. The thermally conductive membrane has slack for permitting the first wedge member to move relative to the base member between a first clamped position and a second unclamped position for releasably securing the circuit card in the circuit card chassis slot. The thermally conductive membrane defines a first thermal conductive path between the circuit card secured by the circuit card clamp and the circuit card chassis slot.

According to an aspect of the invention, the circuit card clamp is also comprised of a second wedge member movable relative to the base member, in response to a second actuator, between a first clamped position and a second unclamped position. The second wedge member is configured for releasably securing the circuit card in the circuit card chassis slot. The base member has a first end portion with a beveled surface for engaging the second wedge member in response to the second actuator.

Notably, a second thermal conductive path is provided by the second wedge member between the circuit card secured by the circuit card clamp and a chassis when the circuit card is secured in the circuit card chassis slot. In this regard, it should be understood that the second wedge member has at least one beveled surface for engaging an adjacent wedge member in response to the second actuator. The adjacent wedge member comprises a threaded bore sized and shaped for receiving a threaded end of the second actuator. The second wedge member further comprises an aperture sized and shaped for receiving an elongated body of at least one of the first and second actuators.

According to another aspect of the invention, the circuit card clamp is further comprised of a third wedge member having an elongated planar conduction surface for engaging the chassis slot in response to the first actuator. Notably, the third wedge member defines a third thermal conduction path between the circuit card and the chassis. In this regard, it should be understood that the third wedge member has a slanted beveled surface for engaging the first wedge member in response to the first actuator. The third wedge member also has a slanted beveled surface for engaging a fourth wedge member. The fourth wedge member has a threaded bore sized and shaped for receiving a threaded end of the first actuator. The third wedge member has aperture sized and shaped for receiving an elongated body of the first and second actuators. The base member has a second end portion with a slanted beveled surface for engaging the third wedge member in response to the first actuator.

According to another aspect of the invention, the circuit card clamp is comprised of a first and second plate. The first plate is coupled the base member. The thermally conductive membrane is at least partially disposed between the first plate and the base member. The second plate is coupled to the first wedge member. The thermally conductive membrane is at least partially disposed between the second plate and the first wedge member.

The present invention also concerns a method for providing a plurality of thermal conduction paths between a circuit card and a chassis. The method involves removably clamping a circuit card in a chassis slot using at least one first wedge member movable relative to a base member in response to a first actuator for engaging the circuit card chassis slot. The method also involves forming a first thermal conduction path between a circuit card and the circuit card chassis slot by using a thermally conductive membrane coupled to the base member and the first wedge member. The method further involves facilitating a relative movement of the first wedge member relative to the base member between a first clamped position and a second unclamped position by providing a slack in the membrane.

According to an aspect of the invention, the method involves providing a second thermally conductive path using at least one second wedge member having an elongated planar clamping surface for applying a clamping force to a circuit card in response to a second actuator. The method also involves providing a third thermally conductive path using at least one third wedge member having an elongated planar conduction surface for engaging the chassis slot in response to the first actuator.

BRIEF DESCRIPTION OF THE DRAWINGS

Embodiments will be described with reference to the following drawing figures, in which like numerals represent like items throughout the figures, and in which.

DETAILED DESCRIPTION OF THE PREFERRED EMBODIMENTS

Figure 1A:
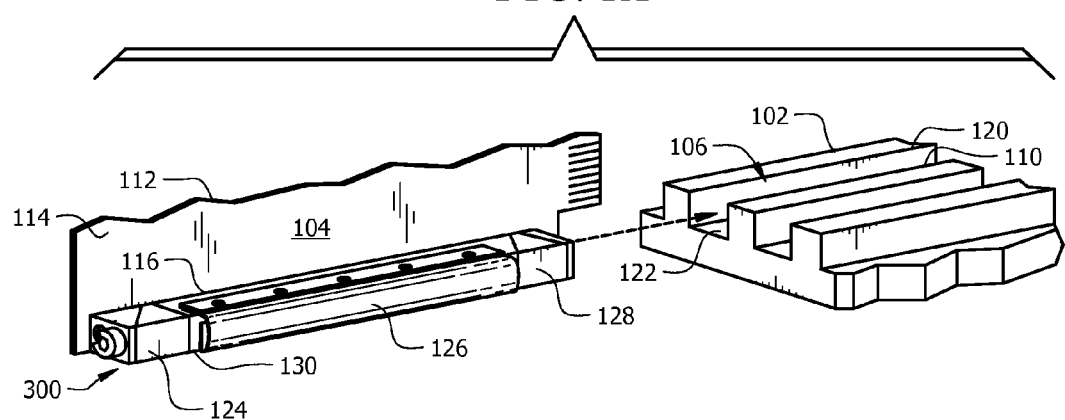
FIG. 1A is an elevated perspective view of a chassis and a circuit card comprising a circuit card clamp assembly that is useful for understanding the present invention.
Figure 1B:
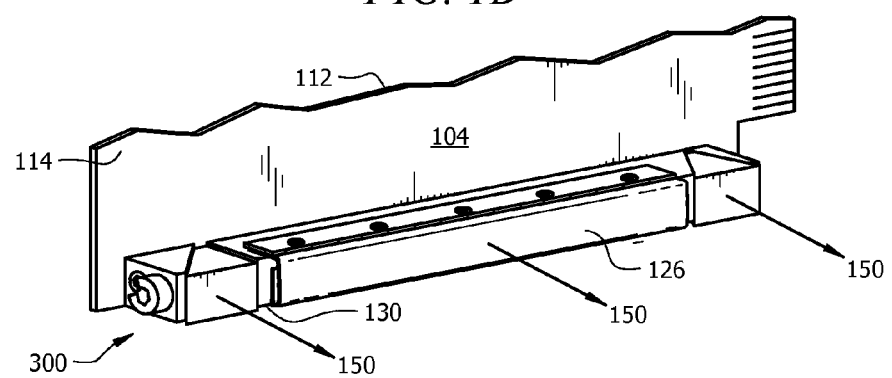
FIG. 1B is an elevated perspective view of a circuit card comprising an actuated circuit card clamp assembly that is useful for understanding the present invention.

Referring now to FIGS. 1A and 1B, there are provided elevated perspective views of a chassis 102 and circuit card 104 comprising a circuit card clamp 300 that is useful for understanding the present invention. The chassis 102 is often comprised of a heat exchanger (i.e., a cold plate or a heat sink) to dissipate heat generated by an electrical circuit implemented on the circuit card 104. However, the chassis 102 can also be comprised of any device commonly used in the art for mounting one or more circuit cards in a vertical arrangement, such as a mounting rack. As shown in FIG. 1, the circuit card clamp 300 is attached to the circuit card 104 so that a surface 116 of the circuit card clamp 300 abuts a surface 114 of the circuit card 104. However, the invention is not limited in this regard. The circuit card clamp 300 can also be adapted for attachment to the chassis 102. For example, the circuit card clamp 300 can be captured in a circuit card chassis slot 106 by at least one alignment pin. Notably, the circuit card clamp 300 can move horizontally and vertically relative to the chassis 102. In such a scenario, an insert space (not shown) is provided between a surface 120 of the chassis 102 and a surface 116 of the circuit card clamp 300. The circuit card 104 can be inserted into the insert space and securely clamped therein by the circuit card clamp 300.

The chassis 102 is comprised of a circuit card chassis slot 106 for receiving the circuit card 104 with the circuit card clamp 300 secured thereto. As such, the slot 106 often has a width larger than the thickness of the circuit card 104 plus the width of the circuit card clamp 300. Once the circuit card 104 is fully positioned within slot 106, the circuit card clamp 300 can be actuated so that a plurality of wedges are moved in a direction 150 (as shown in FIG. 1B) so as to increase a width of the circuit card clamp 300. In effect, a clamping force is applied to the circuit card 104 thereby securing the circuit card 104 in slot 106.

When the circuit card clamp 300 is fully actuated (or engaged), the surface 112 of the circuit card 104 abuts the surface 120 of the chassis. Surfaces 124, 126, 128 of the circuit card clamp 300 abut surface 110 of the chassis 102. At least a portion of surface 130 of the circuit card clamp 300 abuts surface 122 of the chassis 102. The circuit card clamp 300 will be described in detail below (in relation to FIGS. 2-8).

Figure 2:
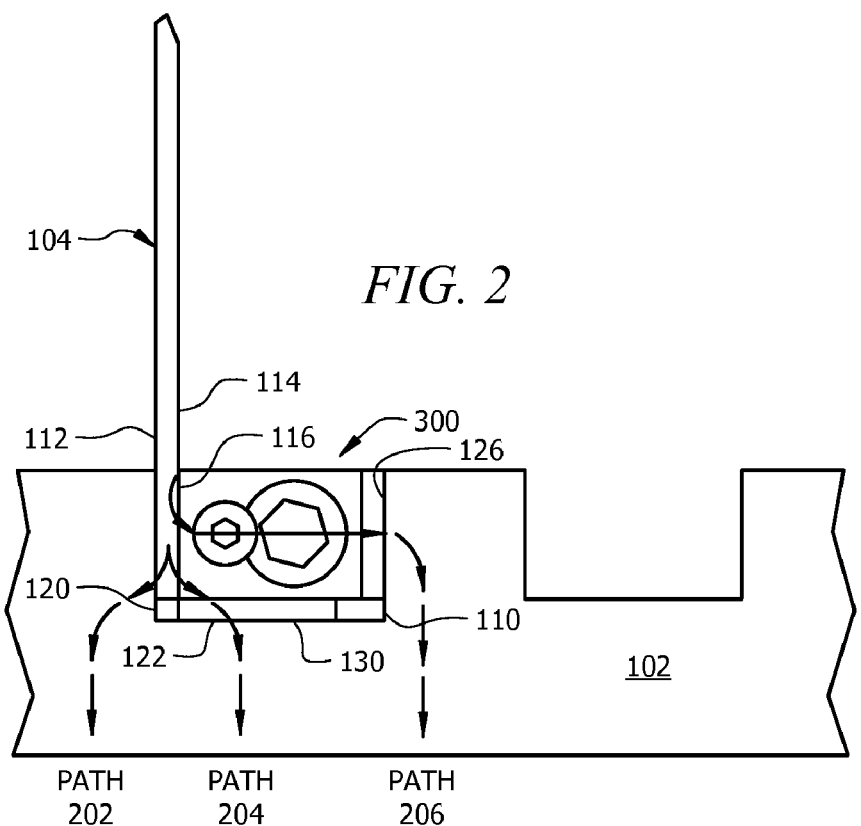
FIG. 2 is a front view of a circuit card secured within a slot of a chassis that is useful for understanding the present invention.

Referring now to FIG. 2, there is provided a front view of a circuit card 104 secured within slot 106 of the chassis 102. Notably, the circuit card clamp 300 provides a system for adequately fastening the circuit card 104 to the chassis 102 to prevent loosening of the circuit card 104 due to external forces, such as vibration forces. The circuit card clamp 300 also provides a clamping system having an optimized thermal interface between the circuit card 104 and the chassis 102. In this regard, it should be understood that the circuit card clamp 300 provides three (3) thermal conductive paths 202, 204, 206 for transferring heat from the circuit card 104 to the chassis 102. The thermal conductive path 202 is provided between the surface 112 of the circuit card 104 and a surface 120 of the chassis 102. The thermal conductive path 204 is provided between (a) a surface 114 of the circuit card 104 and a surface 116 of the circuit card clamp 300 and (b) at least a portion of surface 130 of the circuit card clamp 300 and a surface 122 of the chassis 102. The thermal conductive path 206 is provided between (a) surface 114 of the circuit card 104 and surface 116 of the circuit card clamp 300 and (b) surface 126 of the circuit card clamp 300 and surface 110 of the chassis 102.

As should be understood by those having ordinary skill in the art, heat is transferred between surfaces 124, 128 of the circuit card clamp 300 and surface 110 of the chassis. However, the amount of heat transfer is relatively small as compared to the heat transferred via thermal conductive paths 202, 204, 206. As such, the heat transfer paths provided by surfaces 124, 128, 110 are considered somewhat insignificant.

Figure 3A:
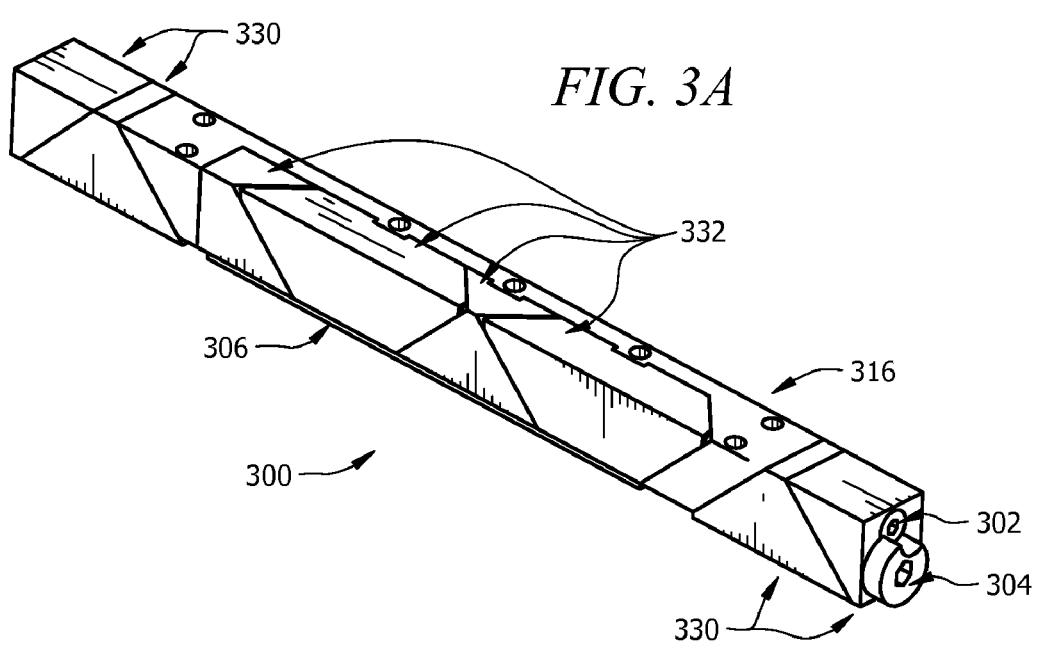
FIG. 3A is an elevated perspective view of a circuit card clamp that is useful for understanding the present invention.
Figure 3B:
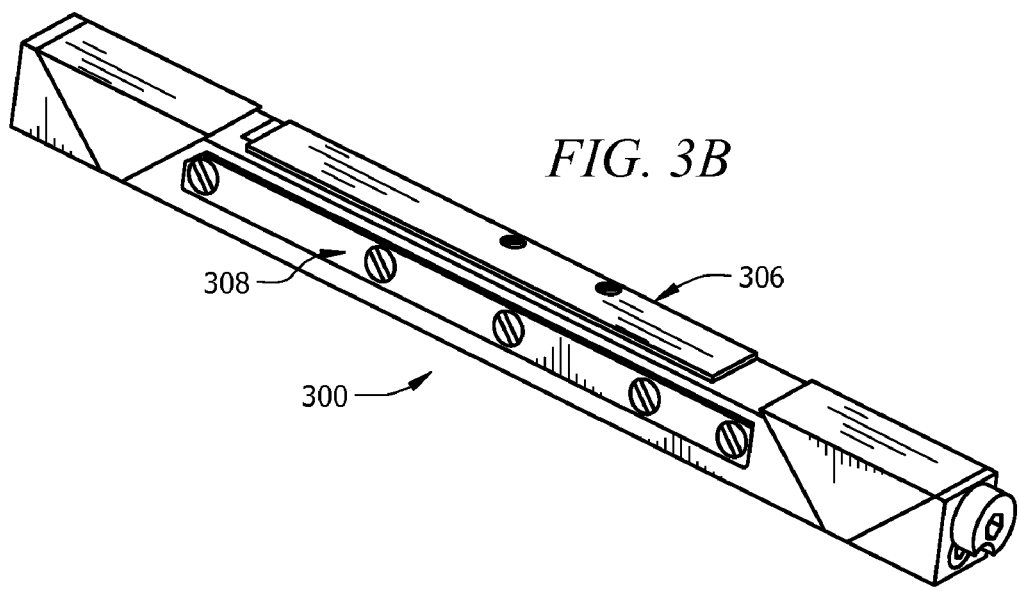
FIG. 3B is an elevated perspective view of a circuit card clamp that is useful for understanding the present invention.
Figure 3C:
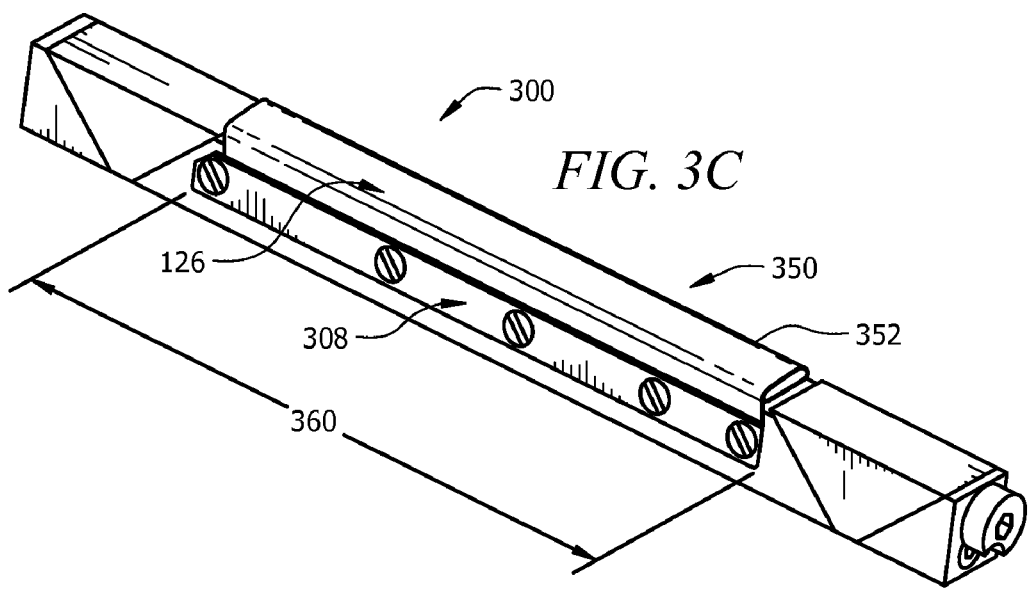
FIG. 3C is an elevated perspective view of a circuit card clamp with a thermally conductive sheet (or heat sink sheet) that is useful for understanding the present invention.

Referring now to FIGS. 3A-3C, there are provided elevated perspective views of the circuit card clamp 300 that is useful for understanding the present invention. As shown in FIGS. 3A-3B, the circuit card clamp 300 is comprised of actuators 302, 304, a base member 316, and sets of wedges 330, 332. The base member 316 has an elongated sheet configured for insertion in the circuit card chassis slot 106 (described above in relation to FIG. 1A). The actuators 302, 304 can comprise any material commonly used in the art (such as steel and stainless steel). The circuit card clamp 300 is also comprised of plates 306, 308.

According to an embodiment of the invention, each of the components 306, 308, 316, 330, 332 are comprised of aluminum. Still the invention is not limited in this regard. Each of the components 306, 308, 316, 330, 332 can be comprised of any material commonly used in the art. Such materials include metals, metal alloys, and composite materials.

Notably, the set of wedges 330 provide the thermal conductive path 202 (described above in relation to FIG. 2) when the actuator 302 is fully actuated. The set of wedges 332 provide the thermal conductive path 204 (described above in relation to FIG. 2) when the actuator 304 is fully actuated.

As shown in FIG. 3C, the circuit card clamp 300 is also comprised of a thermally conductive membrane 350 coupled thereto via plates 306, 308. In this regard, it should be understood that the thermally conductive membrane 350 can be partially wrapped around plate 306 so as to have a first portion (not shown) sandwiched between plate 306 and the set of wedges 332 and a second portion 352 having a surface 126 exposed to an external environment. The thermally conductive membrane 350 can also be inserted under plate 308 so as to have a third portion (not shown) sandwiched between plate 308 and the base member 316. The thermally conductive membrane 350 can have slack for permitting at least one wedge of the set of wedges 332 to move relative to the base member 316 between a first clamped position and a second unclamped position. The wedges 332 are moved between said first and second positions for releasably securing the circuit card 104 (described above in relation to FIG. 1A) in the circuit card chassis slot 106 (described above in relation to FIG. 1A).

The thermally conductive membrane 350 can include any thin highly flexible sheet material having a high thermal conductivity (such as a Pyrolytic Graphite sheet material and a Boron Nitride sheet material). The thermally conductive membrane 350 can have the same or substantially similar width 360 as plate 308. The thermally conductive membrane 350 and plates 306, 308 collectively provide the thermal conductive path 206 (described above in relation to FIG. 2). In this regard, it should be appreciated that a surface 126 of the second portion 352 abuts surface 110 of the chassis 102 during operation of the circuit card clamp 300.

Figure 4:
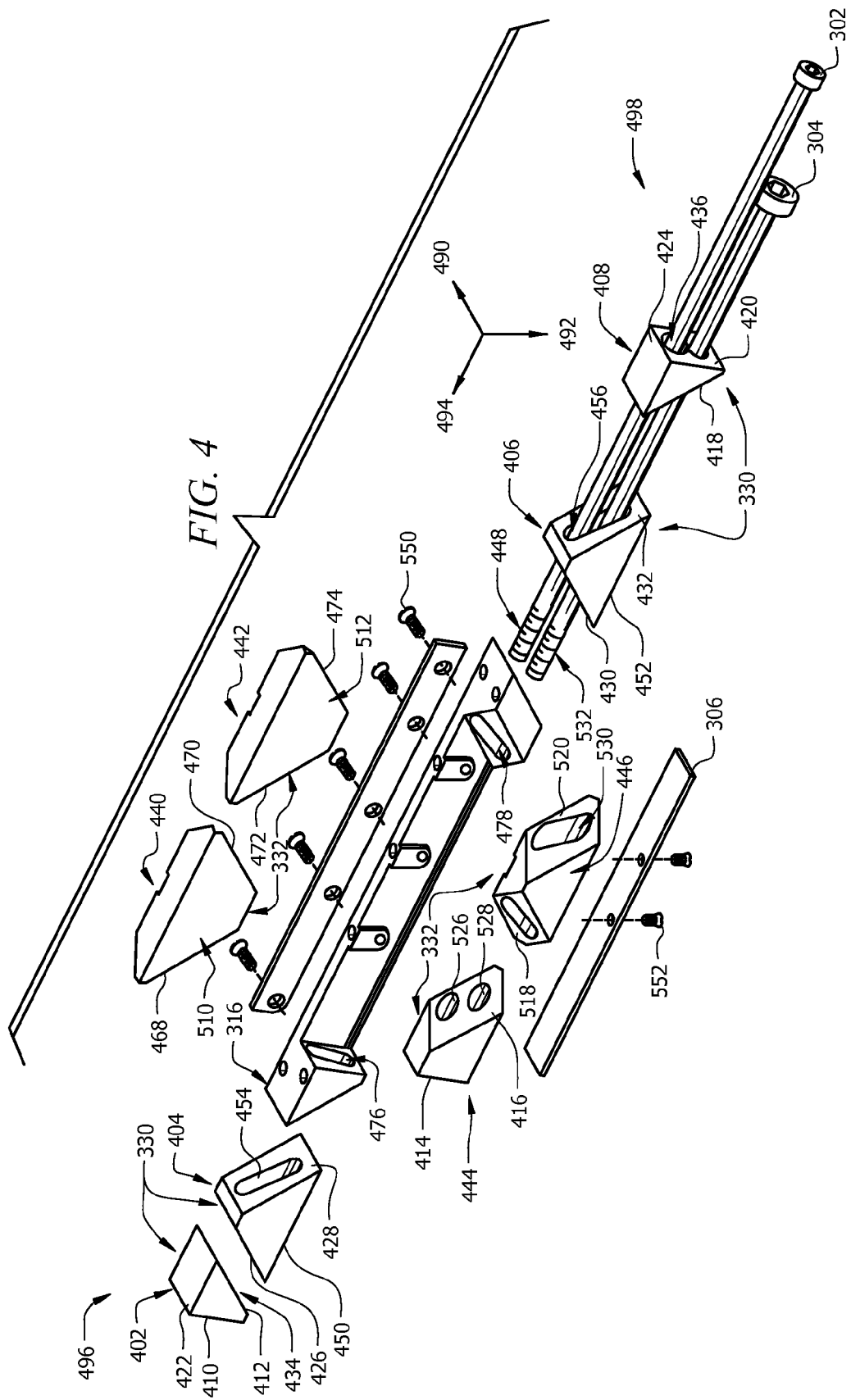
FIG. 4 is an exploded perspective view of a circuit card clamp assembly that is useful for understanding the present invention.
Figure 5:
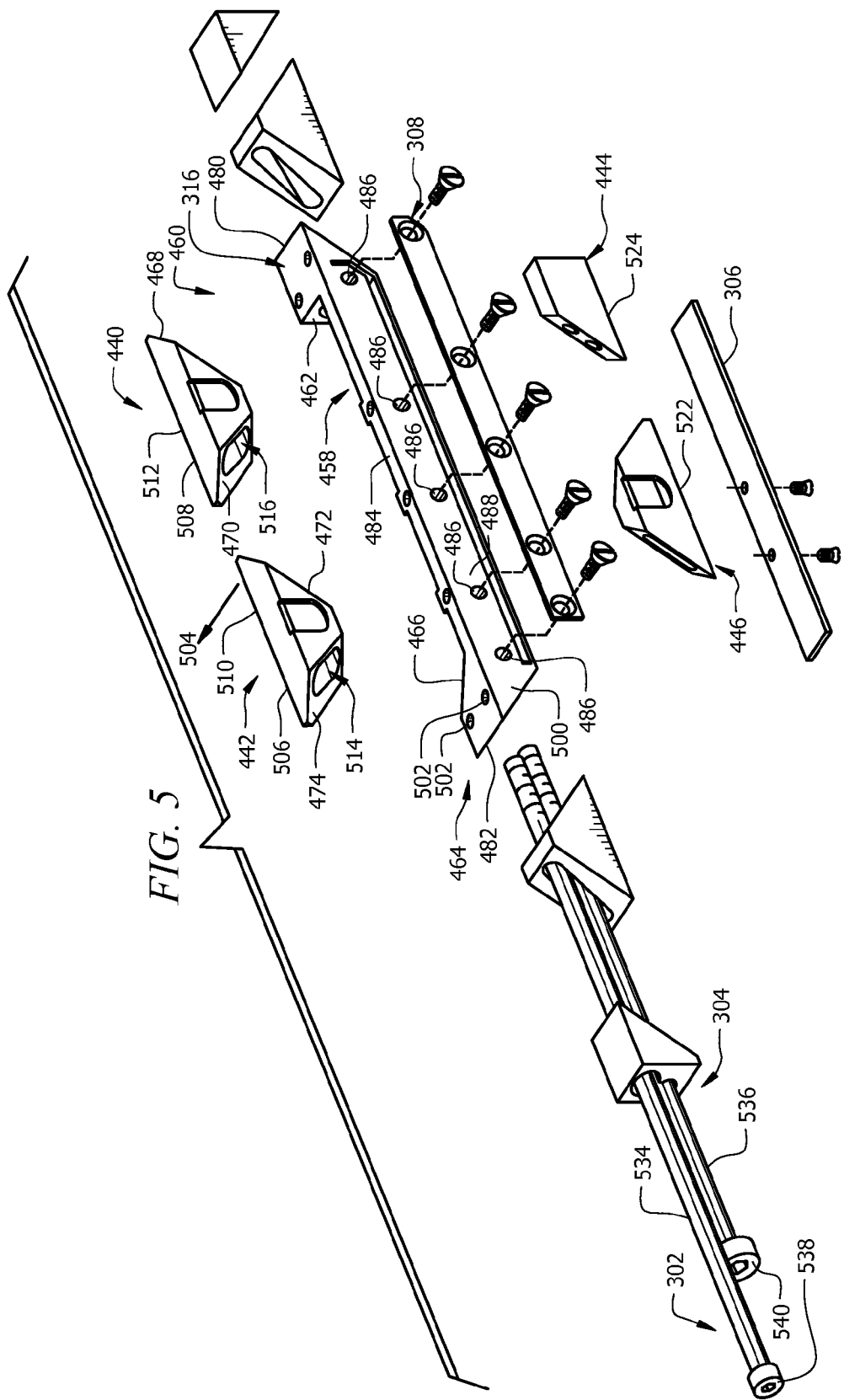
FIG. 5 is an exploded perspective view of a circuit card clamp assembly that is useful for understanding the present invention.

A more detailed discussion of the circuit card clamp 300 will now follow. Referring now to FIGS. 4-5, there are provided exploded perspective views of the circuit card clamp 300 assembly that is useful for understanding the present invention. As shown in FIGS. 4-5, the set of wedges 330 is comprised of four (4) wedge elements 402, 404, 406, 408. The set of wedges 332 is comprised of four (4) wedge elements 440, 442, 444, 446. Still, the invention is not limited in this regard. The sets of wedges 330, 332 can include any number of wedge elements selected in accordance with a particular circuit card clamp 300 application.

Notably, the set of wedges 330 are movable relative to the base member 316, in response to the actuator 302, between a first clamped position and a second unclamped position. Similarly, the set of wedges 332 are movable relative to the base member 316, in response to the actuator 304, between a first clamped position and a second unclamped position. The sets of wedges 330, 332 are moved between said first and second positions for releasably securing the circuit card 104 (described above in relation to FIG. 1A) in the circuit card chassis slot 106 (described above in relation to FIG. 1A).

The wedge elements 402, 408 are end wedge elements residing at opposing ends 496, 498 of the circuit card clamp structure 300. The wedge elements 402, 408 are provided with opposing ends having respective surfaces 410, 412, 418, 420. Surfaces 410, 420 are straight surfaces having an axis along a ninety degree (90°) angle. Still, the invention is not limited in this regard. Surfaces 410, 420 can have an axis along any angle selected in accordance with a particular circuit card clamp 300 application.

Surfaces 412, 418 are configured so that a wedge shaped body can easily slide on top when compressed against the wedge element 402, 408 with a sufficient amount of pressure. According to an embodiment of the invention, surfaces 412, 418 are straight surfaces vertically beveled along an angle between $\pi/6$ radians and $\pi/3$ radians. Still, the invention is not limited in this regard. Surfaces 412, 418 can be beveled along an angle selected in accordance with a particular circuit card clamp 300 application.

The wedge elements 402, 408 are also provided with flat, elongated clamping surfaces 422, 424 which can engage a surface 114 (described above in relation to FIG. 1) of the circuit card 104 (described above in relation to FIG. 1) for exerting a clamping force against the circuit card 104. When the clamping force is exerted on the circuit card 104, a thermal conductive path 202 (described above in relation to FIG. 2) is provided. Stated differently, a surface 112 (described above in relation to FIG. 1) abuts a surface 120 (described above in relation to FIG. 1) of the chassis. The surfaces 112, 120 provide a thermal interface between the circuit card 104 and the chassis 102.

The wedge elements 402, 408 are further provided with apertures 434, 436. Aperture 434 (not viewable in the perspective views of FIGS. 4-5) of wedge element 402 is a threaded aperture sized and shaped for receiving a threaded end 448 of the actuator 302. In effect, actuator 302 can interact with the wedge element 402 so as to increase or decrease a width (not shown) of each wedge pair 402, 404 and 406, 408 of the set of wedges 330. According to an embodiment of the invention, aperture 434 has a substantially circular shape. Still, the invention is not limited in this regard. The aperture 434 can have any shape selected in accordance with a particular circuit card clamp 300 application.

Aperture 436 of wedge element 408 is a non-threaded aperture sized and shaped for receiving actuators 302, 304. According to an embodiment of the invention, the aperture 436 has a substantially circular, oblong, or bone shape. Still, the invention is not limited in this regard. The aperture 436 can have any shape selected in accordance with a particular circuit card clamp 300 application.

The wedge elements 404, 406 reside at opposing ends 496, 498 of the circuit card clamp structure 300. The wedge elements 404, 406 are provided with opposing ends having respective surfaces 426, 428, 430, 432. Surfaces 426, . . . , 432 are configured so that a wedge or ramped shaped body can easily slide on top when compressed against the wedge element 404, 406 with a sufficient amount of pressure. According to an embodiment of the invention, surfaces 426, . . . , 432 are straight surfaces vertically beveled along an angle between $\pi/6$ radians and $\pi/3$ radians. Still, the invention is not limited in this regard. Surfaces 426, . . . , 432 can be beveled along an angle selected in accordance with a particular circuit card clamp 300 application.

The wedge elements 404, 406 are also provided with flat, elongated clamping surfaces 450, 452 which can engage a surface 110 (described above in relation to FIG. 1) of the chassis 102 (described above in relation to FIG. 1) for exerting a clamping force against the circuit card 104 (described above in relation to FIG. 1). As noted, a thermal conductive path 202 (described above in relation to FIG. 2) is provided when the clamping force is exerted on the circuit card 104.

The wedge elements 404, 406 are further provided with apertures 454, 456. Aperture 454 of wedge element 404 is a non-threaded aperture sized and shaped for receiving end 448 of the actuator 302. Aperture 456 of wedge element 406 is a non-threaded aperture sized and shaped for receiving actuators 302, 304. According to an embodiment of the invention, the apertures 454, 456 have substantially circular, oblong, or bone shapes. Still, the invention is not limited in this regard. The aperture 454, 456 can have any shape selected in accordance with a particular circuit card clamp 300 application.

The base member 316 is comprised of a slot 458. Slot 458 is sized and shaped for receiving the set of wedges 332. In this regard, it should be understood that the slot 458 has a first end 460 with a flat surface 462 and a second end 464 with an inclined surface 466. The flat surface 462 is provided for abutting the flat surface 414 of an adjacent wedge element 444. The flat surface 462 prevents the wedge element 444 from sliding a certain distance (defined by the base member 316) in a horizontal direction 494. However, it should be noted that the surface 462 of the base member 316 does not prevent the wedge element 444 from moving in a vertical direction 492 when a force is applied thereto by an adjacent wedge element 440.

The inclined surface 466 is provided for abutting an inclined surface 474 of an adjacent wedge element 442 such that inclined surfaces 474 can easily slide against it when compressed together with a sufficient amount of force. According to an embodiment of the invention, the inclined surface 466 is horizontally slanted by ten to eighty-five degrees (10°-85°) and vertically beveled along an angle between π/6 radians and π/3 radians. Still, the invention is not limited in this regard.

Each of the opposing ends 460, 464 of the base member 316 has a respective aperture 476, 478 formed therein. Aperture 476 is sized and shaped for receiving the actuators 302. Aperture 476 can have any suitable shape (such as a substantially oblong shape, a bone shape, and a circular shape). Similarly, aperture 478 is sized and shaped for receiving the actuators 302, 304. Aperture 478 can have any suitable shape (such as a substantially oblong shape and a bone shape).

Each of the opposing ends 460, 464 has a respective outer inclined surface 480, 482. The inclined surfaces 480, 482 are provided for abutting an inclined surface 428, 430 of an adjacent wedge element 404, 406 such that inclined surfaces 428, 430 can easily slide against them when compressed together with a sufficient amount of force. According to an embodiment of the invention, the inclined surfaces 480, 482 are straight surfaces beveled along an angle between π/6 radians and π/3 radians. Still, the invention is not limited in this regard.

The base member 316 is further comprised of an elongated side member 484. The elongated side member 484 prevents the wedge members 444, 446 from moving in a direction 490 when a sufficient amount of force is applied thereto by an adjacent wedge member 440, 442. The elongated side member 484 is comprised of a plurality of bores 486. Bores 486 are sized and shaped to receive mechanical connectors 550 for securing plate 308 to the elongated side member 484. The mechanical connectors (not shown) can be any mechanical connector commonly used in the art, such as rivets, pins, or screws (as shown in FIG. 4). It should be noted that the elongated side member 484 can include an indent (not shown) so that the plate 308 is flush with a surface 500 of the elongated side member 484 when secured thereto.

The base member 316 can include a plurality of bores 502. Bores 502 are sized and shaped to receive mechanical connectors (not shown) for securing the circuit card clamp 300 to a circuit card 104 or chassis 102. The mechanical connectors (not shown) can be any mechanical connector commonly used in the art, such as rivets, pins, or screws.

The wedge elements 440, 442 are provided with opposing ends having respective surfaces 468, 470, 472, 474. Each of the surfaces 468, . . . , 474 are configured so that a slanted wedge or ramp shaped body can easily slide on top when compressed against the wedge element 440, 442 with a sufficient amount of pressure. Surfaces 468, . . . , 474 are also configured so that the wedge members 440, 442 move in a direction 504 (i.e., away from the elongated side member 484 of the base member 316) when adjacent slanted wedge or ramp shaped bodies apply a sufficient amount of force thereto.

According to an embodiment of the invention, surfaces 468, . . . , 474 are horizontally slanted by ten to eighty-five degrees (10°-85°) and vertically beveled along an angle between π/6 radians and π/3 radians. Still, the invention is not limited in this regard.

The wedge elements 440, 442 are also provided with flat, elongated clamping surfaces 506, 508 which can engage a surface 114 (described above in relation to FIG. 1) of the circuit card 104 (described above in relation to FIG. 1) for exerting a clamping force against the circuit card 104. The wedge elements 440, 442 are further provided with elongated planar conduction surfaces 510, 512 which can engage a surface 122 (described above in relation to FIG. 1) of the chassis 102 (described above in relation to FIG. 1). When surfaces 510, 512 abut surface 122 of the chassis, a thermal conductive path 204 (described above in relation to FIG. 2) can be provided. Stated differently, surfaces 510, 512, 122 provide a thermal interface between the circuit card clamp 300 and the chassis 102.

The wedge elements 440, 442 are further provided with apertures 514, 516. Apertures 514, 516 are non-threaded aperture sized and shaped for receiving actuators 302, 304. According to an embodiment of the invention, the apertures 514, 516 have a substantially circular, oblong, or bone shape. Still, the invention is not limited in this regard. The apertures 514, 516 can have any shape selected in accordance with a particular circuit card clamp 300 application.

The wedge elements 444, 446 are provided with opposing ends having respective surfaces 414, 416, 518, 520. Surface 414 of wedge element 444 is a straight surface having an axis along a ninety degree (90°) angle. Still, the invention is not limited in this regard. Surface 414 can have an axis along any angle selected in accordance with a particular circuit card clamp 300 application.

Each of the surfaces 416, 518, 520 is configured so that a slanted wedge or ramp shaped body can easily slide on top when compressed against the wedge element 444, 446 with a sufficient amount of pressure. Surfaces 416, 518, 520 are also configured so that the wedge members 440, 442 move in a direction 504 (i.e., away from the elongated side member 484 of the base member 316) when the wedge elements 444, 446 apply a sufficient amount of force to the wedge members 440, 442.

According to an embodiment of the invention, surfaces 416, 518, 520 are horizontally slanted by ten to eighty-five degrees (10°-85°) and vertically beveled along an angle between π/6 radians and π/3 radians. Still, the invention is not limited in this regard.

The wedge elements 444, 446 are also provided with flat, elongated conduction surfaces 522, 524 which can abut a thermally conductive membrane 350 (described above in relation to FIG. 2) disposed on or around plate 306. The wedge element 446 has at least one bore (not shown) formed therein (on surface 522) for receiving at least one mechanical connector 552 to secure plate 306 thereto. The mechanical connector 552 can be any mechanical connector commonly used in the art, such as rivets, pins, or screws (as shown in FIG. 4).

The wedge elements 444, 446 are further provided with apertures 526, 528, 530. Aperture 526 of wedge element 444 is a non-threaded aperture sized and shaped for receiving actuator 302. Aperture 528 of wedge element 444 is a threaded aperture sized and shaped for receiving a threaded end 532 of the actuator 304. In effect, actuator 304 can interact with the wedge element 444 so as to increase or decrease a width (not shown) of the set of wedges 332.

According to an embodiment of the invention, apertures 526, 528 have a substantially circular shape. Still, the invention is not limited in this regard. Apertures 526, 528 can have any shape selected in accordance with a particular circuit card clamp 300 application.

Aperture 530 is a non-threaded aperture sized and shaped for receiving actuators 302, 304. According to an embodiment of the invention, aperture 530 has a substantially circular, oblong, or bone shape. Still, the invention is not limited in this regard. Aperture 530 can have any shape selected in accordance with a particular circuit card clamp 300 application.

Plate 308 can be provided with a size and shape suitable for securing the thermally conductive membrane 350 to the base member 316 of the circuit card clamp 300. In contrast, plate 308 can be provided with a size and shape suitable for providing a sufficient surface area for transferring heat between the thermally conductive membrane 350 and a surface 110 of the chassis 102.

Actuators 302, 304 can have an elongated rod shape body 534, 536 and a head 538, 540, respectively. Each of the heads 538, 540 provides a mechanism for rotating a respective rod shaped body 534, 536 with a tool (e.g., a torque wrench) in order to increase or decrease the lengths (not shown) of a set of wedges 330, 332.

According to an embodiment of the invention, head 540 can be provided with a size that is larger than the size of head 538. Head 540 can also be provided with a notch (not visible in the perspective views of FIGS. 4 and 5). This size difference and notch ensure that a certain engagement and disengagement sequence of operation is performed by a user. The engagement sequence of operation can involve rotating actuator 302 in a first direction before rotating actuator 304 in the first direction. The disengagement sequence of operation can involve rotating actuation 304 in a second direction before rotating actuator 302 is the second direction. Still, the invention is not limited in this regard.

Figure 6A:
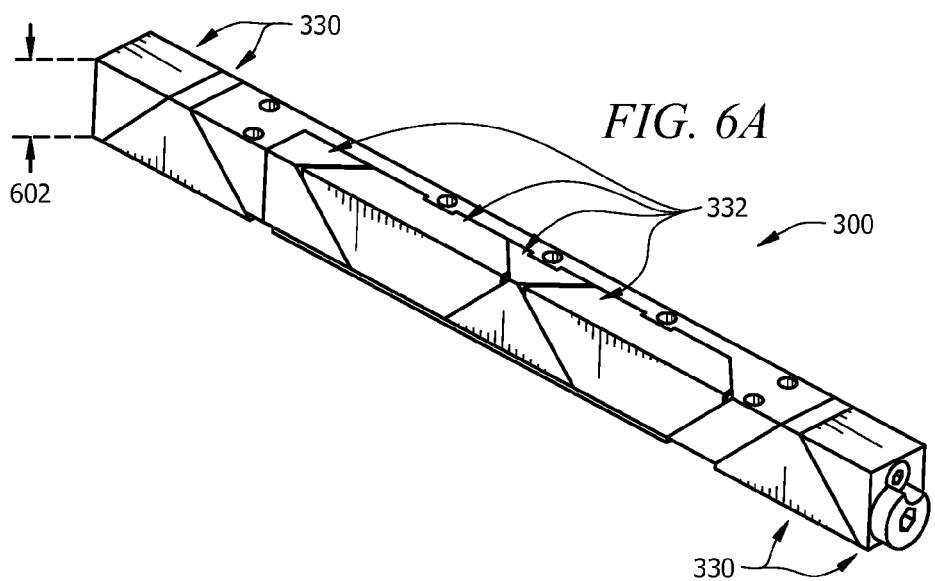
FIGS. 6A-6C collectively illustrate a circuit card clamp engagement that is useful for understanding the present invention.
Figure 6B:
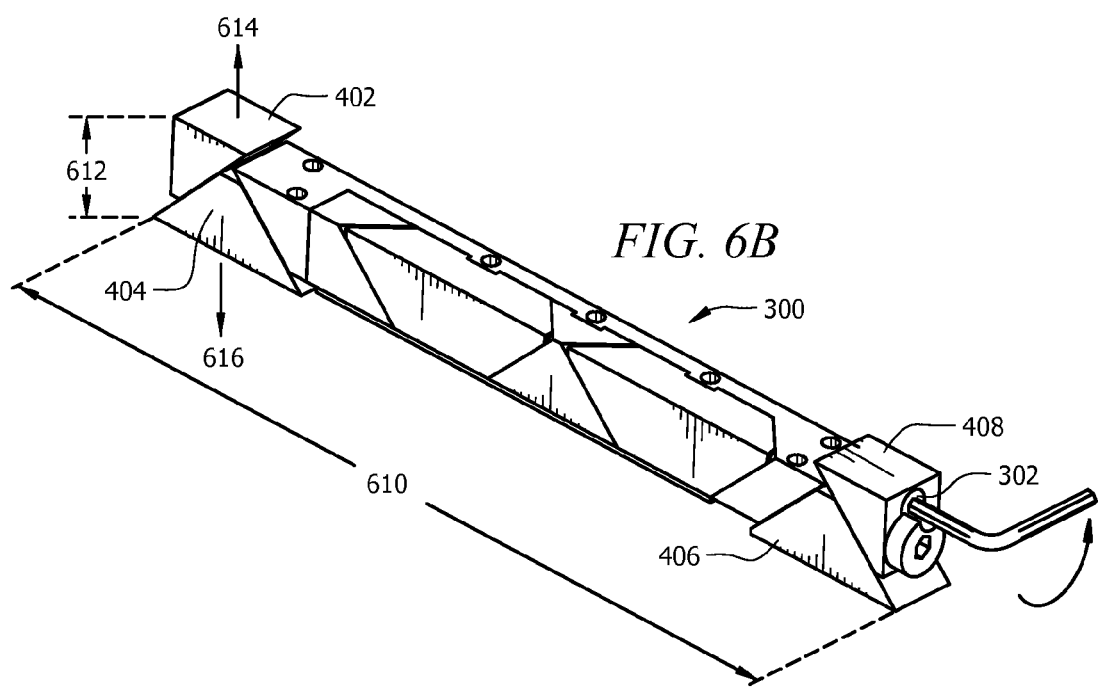
Figure 6C:
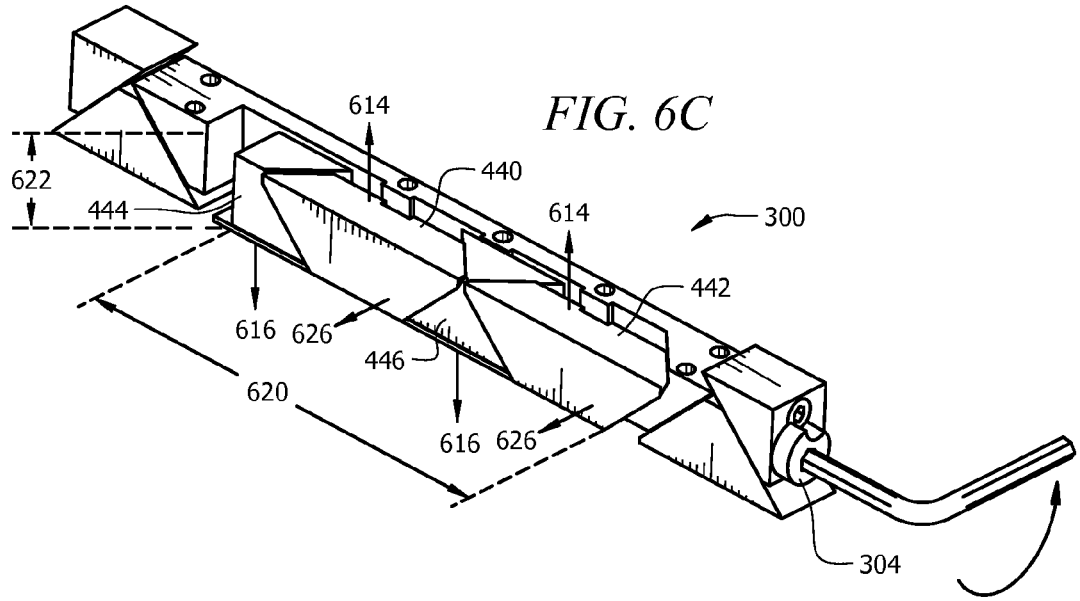

Referring now to FIGS. 6A-6C, there is provided an illustration of a circuit card clamp 300 engagement that is useful for understanding the present invention. As shown in FIG. 6A, the circuit card clamp 300 is in its relaxed state. In this state, the sets of wedges 330, 332 are in their first positions where their widths 602 are minimized. In such a situation, the circuit card clamp 300 can be freely passed into and out of a slot 106 (described above in relation to FIG. 1) of chassis 102 (described above in relation to FIG. 1). Similarly, a circuit card 104 (described above in relation to FIG. 1) with the circuit card clamp 300 secured thereto can be freely passed into and out of a slot 106 (described above in relation to FIG. 1) of chassis 102 (described above in relation to FIG. 1).

Referring now to FIG. 6B, the actuator 302 is in an actuated state where it has been rotated with a tool (e.g., a torque wrench). In effect, the length 610 of the circuit card clamp 300 has been shortened. By shortening the length 610 of the circuit card clamp 300, the wedge elements 402, 404, 406, 408 are compressed thereby creating an increase in the collective widths 612 of the wedge elements 402, 404 and 406, 408.

It should be noted that the wedge elements 402, 408 may not move in the direction 614 as shown in FIG. 6B if the circuit card clamp 300 is coupled to a circuit card 104 (as shown in FIG. 1) or a chassis 102 (described above in relation to FIG. 1). If the circuit card clamp 300 is coupled to a circuit card 104 (as shown in FIG. 1), then surface 114 (described above in relation to FIG. 1) of the circuit card 104 (described above in relation to FIG. 1) will prevent wedge elements 402, 408 from moving in direction 614. However, wedge elements 404, 406 can move in direction 616 as shown in FIG. 6B. As a result, a clamping force can be exerted by the wedge elements 404, 406 partially securing the circuit card 104 to the chassis 102. Also, the thermal conductive path 202 for transferring heat from the circuit card 104 to the chassis 102 may be established.

Referring now to FIG. 6C, the actuator 304 is in an actuated state. In this state, the threaded actuator 304 has been rotated with a tool (e.g., a torque wrench as shown in FIG. 6C). In effect, the collective length 620 of the set of wedges 332 has been shortened. By shortening the length 620 of the set of wedges 332, the wedge elements 440, 442, 444, 446 are compressed thereby creating an increase in the collective width 622 of the wedge elements 440, 442, 444, 446. It should be noted that wedges 440, 442 can move in the directions 614, 626 as the actuator 304 is rotated. In contrast, wedges 444, 446 can move in the direction 616 as the actuator 304 is rotated.

Figure 7:
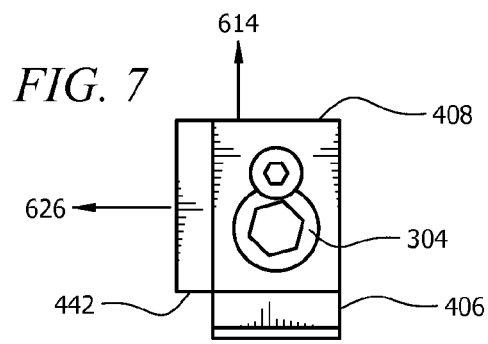
FIG. 7 is a front view of the circuit card clamp of FIG. 6C that is useful for understanding the present invention.
Figure 8:
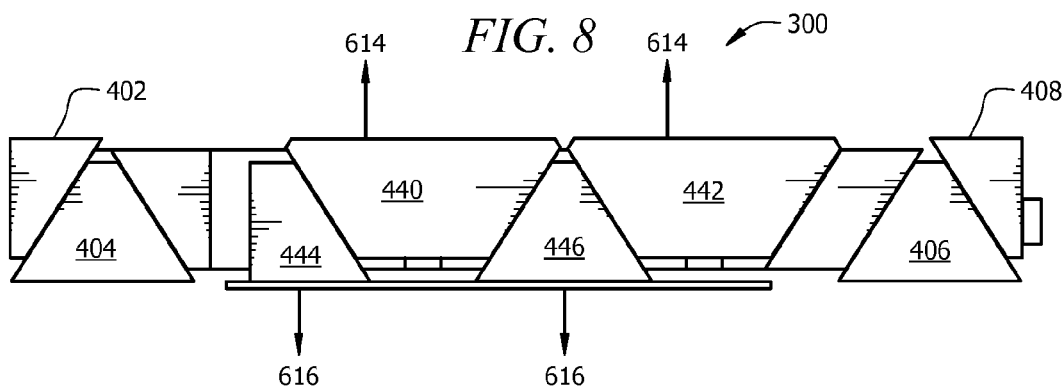
FIG. 8 is a side view of the circuit card clamp of FIG. 6C that is useful for understanding the present invention.

The movement of wedge elements 440, 442 is more evident from FIGS. 7 and 8. A front view of the circuit card clamp 300 in its actuated state is shown in FIG. 7. As shown in FIG. 7, the wedge element 442 is moved in directions 614 and 626. A side view of the circuit card clamp 300 in its actuated state is shown in FIG. 8. As shown in FIG. 8, wedge elements 440, 442 are moved in the direction 614 and wedge elements 444, 446 are moved in the direction 616.

It should be noted that the wedge elements 440, 442 may not move in the direction 614 as shown in FIG. 6C if the circuit card clamp 300 is coupled to a circuit card 104 (as shown in FIG. 1) or a chassis 102 (described above in relation to FIG. 1). If the circuit card clamp 300 is coupled to a circuit card 104 (as shown in FIG. 1), then surface 114 (described above in relation to FIG. 1) of the circuit card 104 (described above in relation to FIG. 1) will prevent wedge elements 440, 442 from moving in direction 614. However, wedge elements 440, 442 can move in direction 626 as shown in FIG. 6C. As a result, surfaces 510, 512 (described above in relation to FIGS. 4-5) of wedge elements 440, 442 can abut surface 122 (described above in relation to FIG. 1) of the chassis 102 (described above in relation to FIG. 1). Also, surface 126 (described above in relation to FIG. 1) can abut surface 110 (described above in relation to FIG. 1) of the chassis 102 (described above in relation to FIG. 1). In such a scenario, thermal conductive paths 204, 206 (described above in relation to FIG. 2) for transferring heat from the circuit card clamp 300 to the chassis 102 may be established.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A circuit card clamp, comprising:
    a base member having an elongated shape configured for insertion in a circuit card chassis slot;
    at least one first wedge member movable in a first direction relative to said base member in response to a first actuator for engaging said circuit card chassis slot;
    at least one second wedge member being movable in a second direction relative to said base member in response to a second actuator, said second direction being perpendicular to said first direction; and
    a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot.

2. The circuit card clamp according to claim 1, wherein said thermally conductive membrane defines a first thermal conductive path between a circuit card secured by said circuit card clamp and said circuit card chassis slot.

3. A circuit card clamp, comprising:
    a base member having an elongated shape configured for insertion in a circuit card chassis slot;
    at least one first wedge member movable relative to said base member in response to a first actuator for engaging said circuit card chassis slot;
    at least one second wedge member movable relative to said base member, in response to a second actuator, between a first clamped position and a second unclamped position, and configured for releasably securing said circuit card in said circuit card chassis slot; and
    a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot.

4. The circuit card clamp according to claim 3, wherein a second thermal conductive path is provided by said at least one second wedge member between a circuit card secured by said circuit card clamp and a chassis when said circuit card is secured in said circuit card chassis slot.

5. The circuit card clamp according to claim 3, wherein said at least one second wedge member further comprises at least one beveled surface for engaging an adjacent wedge member in response to said second actuator.

6. The circuit card clamp according to claim 5, wherein said adjacent wedge member comprises a threaded bore sized and shaped for receiving a threaded end of said second actuator.

7. The circuit card clamp according to claim 3, wherein said at least one second wedge member further comprises an aperture sized and shaped for receiving an elongated body of at least one of said first and second actuators.

8. The circuit card clamp according to claim 3, wherein said base member comprises a first end portion having a beveled surface for engaging said at least one second wedge member in response to said second actuator.

9. A circuit card clamp, comprising:
    a base member having an elongated shape configured for insertion in a circuit card chassis slot;
    at least one first wedge member movable relative to said base member in response to a first actuator for engaging said circuit card chassis slot;
    at least one third wedge member having an elongated planar conduction surface for engaging said chassis slot in response to said first actuator; and
    a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot.

10. The circuit card clamp according to claim 9, wherein said at least one third wedge member defines a third thermal conduction path between a circuit card and a chassis.

11. The circuit card clamp according to claim 9, wherein said at least one third wedge member comprises a slanted beveled surface for engaging said at least one first wedge member in response to said first actuator.

12. The circuit card clamp according to claim 9, wherein said at least one third wedge member comprises a slanted beveled surface for engaging a fourth wedge member, having a threaded bore sized and shaped for receiving a threaded end of said first actuator.

13. The circuit card clamp according to claim 9, wherein said at least one third wedge member further comprises an aperture sized and shaped for receiving an elongated body of said first and second actuators.

14. The circuit card clamp according to claim 9, wherein said base member comprises a second end portion having a slanted beveled surface for engaging said at least one third wedge member in response to said first actuator.

15. A circuit card clamp, comprising:
    a base member having an elongated shape configured for insertion in a circuit card chassis slot;
    a plate coupled said base member;
    at least one first wedge member movable relative to said base member in response to a first actuator for engaging said circuit card chassis slot; and
    a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot;
    wherein said thermally conductive membrane is at least partially disposed between said plate and said base member.

16. A circuit card clamp, comprising:
    a base member having an elongated shape configured for insertion in a circuit card chassis slot;
    at least one first wedge member movable relative to said base member in response to a first actuator for engaging said circuit card chassis slot;
    a plate coupled to said at least one first wedge member and
    a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot;
    wherein said thermally conductive membrane is at least partially disposed between said plate and said at least one first wedge member.

17. A method for providing a plurality of thermal conduction paths between a circuit card and a chassis, comprising the steps of:

removably clamping a circuit card in a chassis slot using at least one first wedge member movable in a first direction relative to a base member in response to a first actuator for engaging said circuit card chassis slot; and forming a first thermal conduction path between a circuit card and said circuit card chassis slot by using a thermally conductive membrane coupled to said base member and said at least one first wedge member;

forming a second thermal conduction path using at least one second wedge member movable in a second direction relative to said base member in response to a second actuator, said second direction being perpendicular to said first direction; and facilitating a relative movement of said at least one first wedge member relative to said base member between a first clamped position and a second unclamped position by providing a slack in said membrane.

18. A method for providing a plurality of thermal conduction paths between a circuit card and a chassis, comprising the steps of:

removably clamping a circuit card in a chassis slot using at least one first wedge member movable relative to a base member in response to a first actuator for engaging said circuit card chassis slot; and forming a first thermal conduction path between a circuit card and said circuit card chassis slot by using a thermally conductive membrane coupled to said base member and said at least one first wedge member;

providing a second thermally conductive path using at least one second wedge member having an elongated planar clamping surface for applying a clamping force to a circuit card in response to a second actuator; and facilitating a relative movement of said at least one first wedge member relative to said base member between a first clamped position and a second unclamped position by providing a slack in said membrane.

19. The method according to claim 18, further comprising the step of providing a third thermally conductive path using at least one third wedge member having an elongated planar conduction surface for engaging said chassis slot in response to said first actuator.

20. A circuit card clamp, comprising:

a base member having an elongated shape configured for insertion in a circuit card chassis slot;

at least one first wedge member movable relative to said base member in response to a first actuator for engaging said circuit card chassis slot;

at least one second wedge member having an elongated planar conduction surface for engaging said chassis slot in response to said first actuator; and a thermally conductive membrane coupled to said base member and said at least one first wedge member, said thermally conductive membrane having slack for permitting said at least one first wedge member to move relative to said base member between a first clamped position and a second unclamped position for releasably securing a circuit card in said circuit card chassis slot;

wherein said thermally conductive membrane defines a first thermal conductive path between a circuit card secured by said circuit card clamp and said circuit card chassis slot.

* * * * *